(12) United States Patent
Krotov et al.

(10) Patent No.: US 10,186,448 B2
(45) Date of Patent: Jan. 22, 2019

(54) WAFER SUPPORT PEDESTAL WITH WAFER ANTI-SLIP AND ANTI-ROTATION FEATURES

(71) Applicant: Lam Research Corporation, Fremont, CA (US)

(72) Inventors: Peter Krotov, San Jose, CA (US); Eric H. Lenz, Livermore, CA (US)

(73) Assignee: Lam Research Corporation, Fremont, CA (US)

( * ) Notice: Subject to any disclaimer, the term of this patent is extended or adjusted under 35 U.S.C. 154(b) by 227 days.

(21) Appl. No.: 15/154,565

(22) Filed: May 13, 2016

(65) Prior Publication Data

US 2017/0170051 A1 Jun. 15, 2017

Related U.S. Application Data

(60) Provisional application No. 62/266,472, filed on Dec. 11, 2015.

(51) Int. Cl.
*H01L 21/687* (2006.01)

(52) U.S. Cl.
CPC .... *H01L 21/68735* (2013.01); *H01L 21/6875* (2013.01); *H01L 21/68721* (2013.01); *H01L 21/68757* (2013.01); *H01L 21/68785* (2013.01)

(58) Field of Classification Search
None
See application file for complete search history.

(56) References Cited

U.S. PATENT DOCUMENTS

| 5,006,799 A * | 4/1991 | Pfanstiehl | G01B 7/105 324/230 |
| 6,264,467 B1 * | 7/2001 | Lue | C23C 16/4581 211/41.18 |
| 2003/0049580 A1 * | 3/2003 | Goodman | C23C 16/4581 432/258 |
| 2015/0332951 A1 * | 11/2015 | Male | C23C 16/458 361/234 |

* cited by examiner

*Primary Examiner* — Joseph J Hail
*Assistant Examiner* — Brian D Keller
(74) *Attorney, Agent, or Firm* — Weaver Austin Villeneuve & Sampson LLP

(57) ABSTRACT

An apparatus for semiconductor processing that includes a pedestal that includes a wafer support surface that includes a plurality of mesas and a pattern of grooves is provided. Each mesa may be bracketed between two or more grooves, each mesa may include a plurality of mesa side walls that intersect, at least in part, with one of the grooves and with a mesa top surface that is a substantially planar surface, the mesa top surfaces may be substantially coplanar with each other, and the mesa top surfaces may be configured to support a wafer during semiconductor operations.

19 Claims, 12 Drawing Sheets

WAFER SUPPORT PEDESTAL WITH WAFER ANTI-SLIP AND ANTI-ROTATION FEATURES

CROSS REFERENCE TO RELATED APPLICATIONS

This application claims benefit of priority under 35 U.S.C. § 119(e) to U.S. Provisional Application No. 62/266,472, filed on Dec. 11, 2015, which is hereby incorporated by reference herein in its entirety.

BACKGROUND

During semiconductor processing operations, semiconductor wafers may be exposed to various semiconductor processing environments within a semiconductor processing chamber. Such environments may include varying levels of chamber pressure, different kinds of reactant gases, different temperatures, and the presence or absence of a plasma, in addition to other varying parameters.

SUMMARY

Figure 1:
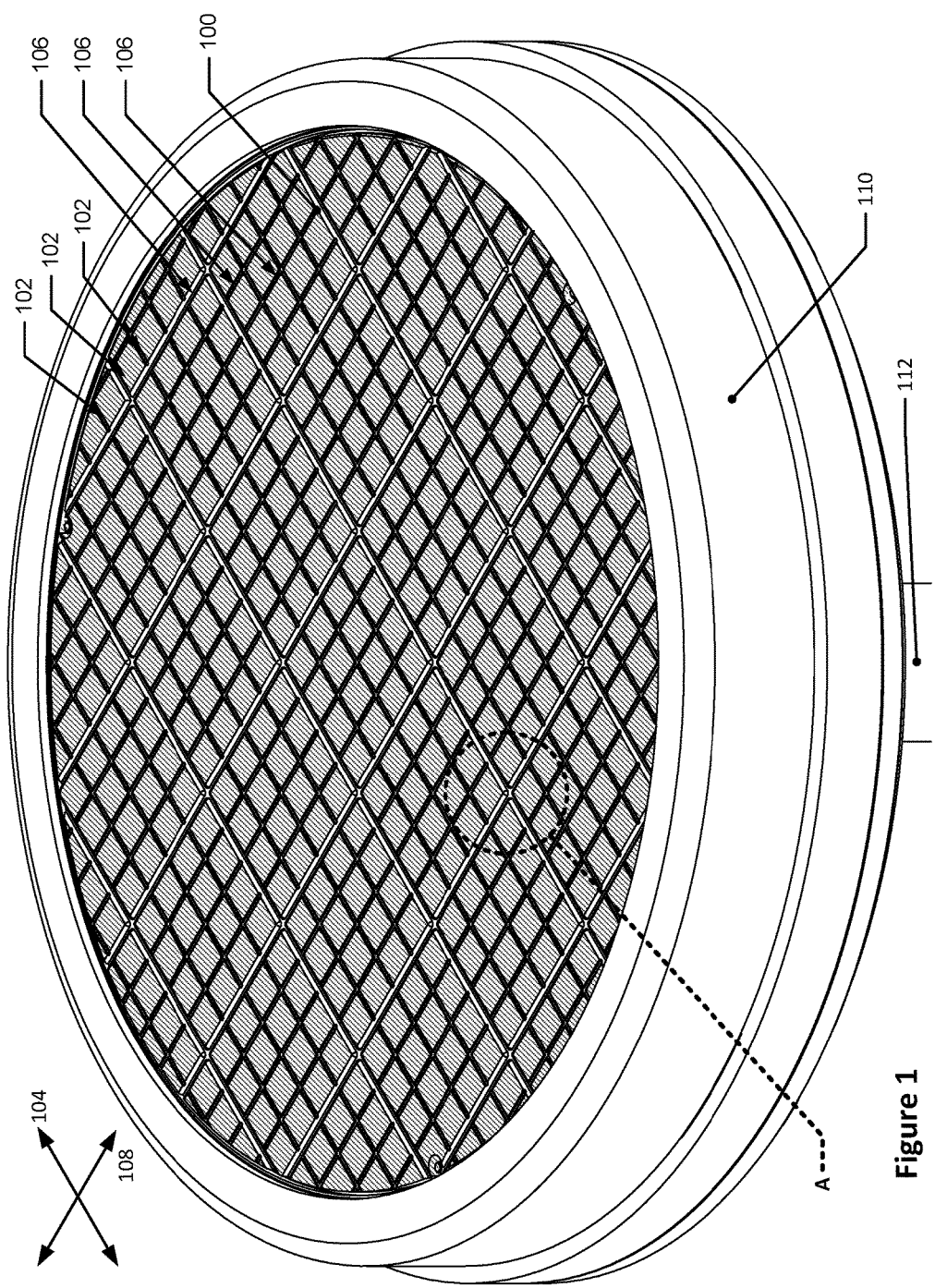
FIG. 1 depicts an isometric view of a pedestal.

In one embodiment, an apparatus for semiconductor process may be provided. The apparatus may include a pedestal that includes a wafer support surface that includes a plurality of mesas and a pattern of grooves. Each mesa may be bracketed between two or more grooves, each mesa may include a plurality of mesa side walls that each intersect, at least in part, with one of the grooves and with a mesa top surface that is a substantially planar surface, the mesa top surfaces may be substantially coplanar with each other, and the mesa top surfaces may be configured to support a wafer during semiconductor operations.

In some embodiments, the pedestal may not include features to supply gas to the grooves or to the mesas.

In some embodiments, the pattern of grooves may include a first linear array of grooves parallel to and arrayed along a first axis and a second linear array of grooves parallel to and arrayed along a second axis that is orthogonal to the first axis.

In some such embodiments, the pattern of grooves may include of a plurality of deep grooves with a first depth and a first width and a plurality of shallow grooves with a second depth and a second width. In such embodiments, the first linear array of grooves may include one or more of: two or more deep grooves and two or more shallow grooves, the second linear array of grooves may include one or more of: two or more deep grooves and two or more shallow grooves, the second depth may be less than the first depth, and the second width may be less than the first width.

In some further such embodiments, two or more deep grooves may be included in the first linear array, two or more deep grooves may be included in the second linear array, two or more shallow grooves may be included in the first linear array, and two or more shallow grooves may be included in the second linear array.

In some further such embodiments, one or more shallow grooves of the first linear array may be included between each pair of adjacent deep grooves of the first linear array, and one or more shallow grooves of the second linear array may be included between each pair of adjacent deep grooves of the second linear array.

In some further such embodiments, the deep grooves in each linear array may be equally spaced from adjacent deep grooves in that linear array, three shallow grooves of the first linear array may be located, and spaced substantially equally, between each pair of deep grooves of the first linear array, and three shallow grooves of the second linear array may be located, and spaced substantially equally, between each pair of deep grooves of the second linear array.

In other such embodiments, each groove may have a depth and a width that are substantially equal to the depth and the width of the other grooves, and each groove arrayed along each axis may be spaced equally from the other grooves arrayed along the same axis.

In some embodiments, the grooves in the first linear array of grooves may be spaced substantially equally apart from each other, and the grooves in the second linear array of grooves may be spaced substantially equally apart from each other.

In some embodiments, each mesa may include a plurality of upper edges which form, at least in part, the perimeter of that mesa's mesa top surface, each upper edge may be the intersection of a mesa top surface and a mesa side wall, and one or more of the upper edges may be rounded or chamfered.

In some embodiments, each upper edge of substantially all of the mesas may be rounded or chamfered.

In some embodiments, one or more grooves may extend to an outer perimeter of the pedestal.

In some embodiments, at least some of the grooves follow paths that may include a linear array of paths, an array of nonlinear paths, an array of curved paths, or an array of fractal branching paths.

In some embodiments, the wafer support surface may be coated with an oxidation layer.

In some embodiments, the apparatus may further include a guard ring that includes a wall that may have a thickness in a direction perpendicular to a center axis of the guard ring and a height with a vertical component parallel to the center axis of the guard ring. The guard ring may also have a flange that may extend inwards in a direction towards the center axis from an edge of the wall. At least a portion of the guard ring may extend around an outer diameter of the pedestal, the flange may have an inner diameter less than the diameter of the wafer, and the guard ring may be configured to cause a wafer that is placed on the pedestal to overlap a section of the flange when viewed parallel to the center axis.

In some further such embodiments, the apparatus may further include a baseplate. The pedestal may be above and proximate to the baseplate, the wall of the guard ring may extend downwards past the pedestal in a direction parallel to the center axis, the guard ring may include one or more foot areas that extend past a bottom surface of the guard ring and contact the baseplate to cause the bottom surface to be offset from the baseplate in a direction parallel to the center axis by a first non-zero gap, and at least a portion of an interior surface of the guard ring that faces towards the baseplate in a direction perpendicular to the center axis may be recessed to cause the portion of the interior surface to be offset from the baseplate in a direction perpendicular to the center axis by a second non-zero gap.

In some such further embodiments, the guard ring may have an interior diameter in each region corresponding with each foot region that causes the guard ring and baseplate to interface such that the guard ring is centered on the baseplate.

DETAILED DESCRIPTION

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific implementations, it will be understood that these implementations are not intended to be limiting.

There are many concepts and implementations described and illustrated herein. While certain features, attributes and advantages of the implementations discussed herein have been described and illustrated, it should be understood that many others, as well as different and/or similar implementations, features, attributes and advantages of the present inventions, are apparent from the description and illustrations. As such, the below implementations are merely some possible examples of the present disclosure. They are not intended to be exhaustive or to limit the disclosure to the precise forms, techniques, materials and/or configurations disclosed. Many modifications and variations are possible in light of this disclosure. It is to be understood that other implementations may be utilized and operational changes may be made without departing from the scope of the present disclosure. As such, the scope of the disclosure is not limited solely to the description below because the description of the above implementations has been presented for the purposes of illustration and description.

Importantly, the present disclosure is neither limited to any single aspect nor implementation, nor to any single combination and/or permutation of such aspects and/or implementations. Moreover, each of the aspects of the present disclosure, and/or implementations thereof, may be employed alone or in combination with one or more of the other aspects and/or implementations thereof. For the sake of brevity, many of those permutations and combinations will not be discussed and/or illustrated separately herein.

During semiconductor processing, semiconductor wafers, e.g., 200 mm, 300 mm, or 450 mm diameter wafers that are, for example, 1 mm or so thick, may be supported on a pedestal or wafer chuck within the semiconductor processing chamber. Such pedestals are generally circular and sized larger in diameter than the semiconductor wafers that they are designed to support. Pedestals may also include a plurality of lift pins, usually three, that may be translated along axes normal to the wafer support plane of the pedestal in order to lift a wafer that is placed on the pedestal off of the pedestal's upper surface, e.g. a wafer support surface, (or to lower a wafer onto the pedestal's upper surface). The wafer support surface may be sized substantially equal to, e.g. within +/−5% of the wafer diameter, or smaller than the wafer. The lift pins allow a wafer-handling robot having blade-type end effectors, e.g., spatula-like end effectors, to insert an end effector under the wafer (when the wafer is raised) to allow the wafer handling robot to transport the wafer to and from the pedestal.

When wafers are lowered onto the pedestal by the lift pins while there is atmosphere in the semiconductor processing chamber, gas may be trapped between the wafer and the pedestal. While most of this trapped gas may eventually escape from between the wafer and the pedestal, this process is not instantaneous, which means that, in effect, a thin cushion of higher-pressure gas will exist between the pedestal, e.g., the wafer support surface, and the wafer until sufficient gas has escaped to allow the pressure of the trapped gas to equalize with the surrounding chamber pressure. The wafer, while floating on this cushion of higher-pressure gas, may be lifted off of the pedestal slightly by the higher pressure gas and may slide relative to the pedestal, both rotationally and/or translationally.

For example, a wafer may be placed onto the lift pins of the pedestal when the chamber pressure is in the 40-90 Torr range; when the wafer is lowered onto the wafer support surface of the pedestal, the present inventors have determined that the gas that is trapped under the wafer may, due to the weight of the wafer, experience an increased pressure that slowly equalizes with the chamber pressure as the higher-pressure gas escapes from beneath the wafer by bleeding out along the gap between the wafer edge and the wafer support surface of the pedestal. During this equalization process, the previously-discussed cushion of gas may allow the wafer to slide relative to the pedestal. After the pressure of the trapped gas has equalized with the ambient chamber pressure, the trapped gas will no longer float the wafer, and the wafer will rest on the pedestal.

The present inventors have determined that in addition to potential relative motion (in the plane of the wafer) between the pedestal and the wafer during placement of the wafer on the pedestal, there may be additional relative motion between the wafer and the pedestal that occurs after the wafer has been lowered onto the pedestal and the gas trapped under the wafer has equalized with the ambient pressure environment of the semiconductor processing chamber. Such additional relative motion may occur, for example, when the pressure in the semiconductor processing chamber is reduced further.

Additionally, even though the majority of the trapped gas will have escaped after the aforementioned equalization process, there will still be a small amount of gas trapped between the wafer and the wafer support surface. For example, due to surface roughness of the wafer support surface, there will be small gaps between the wafer and the wafer support surface that may trap small pockets of gas. In preparation for wafer processing operations, the gas in the semiconductor processing chamber may be evacuated to cause the semiconductor processing chamber pressure to be reduced to a much lower level, e.g., ~10-20 mTorr, as compared to the pressure when the wafer was placed on the wafer support surface. When this pressure reduction is performed, whatever gas is still trapped under the wafer may not be able to equalize with the ambient pressure environment in the chamber and may thus form another pocket of higher-pressure gas, which may cause the cushioning effect to reappear, allowing the wafer to float again and potentially translate and rotate relative to the pedestal. While the trapped gas will eventually escape and cause the pressure under the wafer to equalize with the reduced chamber pressure, the wafer may move while the equalization process is under way.

Thus, there are at least two instances in such a semiconductor processing scenario where there may be relative movement between the wafer and the wafer support surface. Such movement may be quite small, e.g., on the order of 1-2 mm or less and/or less than 0.5° of relative rotation, but given the increasingly smaller feature size of semiconductor features, such small shifts in movement are increasingly of concern to semiconductor manufacturers.

The present inventors realized that modifying such a pedestal such that the wafer support surface of the pedestal that supports the semiconductor wafer includes a pattern of grooves may allow the gas that is trapped between the wafer and the wafer support surface to vent much more quickly than with a pedestal without such grooves.

FIG. 1 depicts an isometric view of an example pedestal with a pattern of grooves in the wafer support surface. In some implementations, such as the implementation of FIG. 1, a pedestal 100 (which may be sized to support a 300 mm diameter wafer, not shown), that includes the grooves may have the grooves arranged in a grid-like network, e.g., one linear array of grooves 102 arrayed along a first axis 104 (three grooves of this linear array of grooves 102 are identified in FIG. 1, although more are depicted), and a second linear array of grooves 106 arrayed along a second axis 108 perpendicular to the first axis (three grooves of this second linear array 106 are also identified in FIG. 1, although more are depicted). In some such implementations, the spacing of the grooves in each array may be equal such that the grooves form a square grid, although in other implementations, such equal spacing may not be used. FIG. 1 also depicts a guard ring 110 around the pedestal 100, discussed below, and a support column 112.

In some further such implementations, there may be grooves of different sizes and depths. For example, there may be two different depths and widths of grooves. In such implementations, one type of groove may be relatively shallow and narrow. The other type of groove may, for example, be significantly deeper and wider. Such grooves may be arranged in a particular fashion to encourage the rapid escape of gas from beneath the wafer. In some implementations, the deep grooves may be considered "first grooves" and the shallow grooves may be considered "second grooves".

The grooves, for example, may be laid out such that there are three shallow grooves equally-spaced between each pair of deeper grooves. In other implementations, there may be a different number of shallow grooves between each pair of adjacent deeper grooves, e.g., 2 or 4 shallow grooves between each pair of adjacent deeper grooves. The portions of the wafer support surface bracketed between each of the grooves (regardless of depth/width of the grooves) may form "mesas" such that each mesa may include a mesa top surface and mesa side walls that cause the mesa top surface to be offset from the bottoms of the grooves bracketing that mesa. The bottoms of the grooves may also be considered offset from the mesa top surfaces; the grooves are in effect, reverse mesas. The mesa top surfaces may be co-planar with one another so as to all generally contact the wafer when the wafer is placed on the wafer support surface (the tops of the mesas in FIG. 1 are indicated with a cross-hatching pattern). In some embodiments, the mesa top surfaces may be substantially co-planar, which means that a mesa top surface may be +/−5 degrees of planar with the other mesa top surfaces. Additionally, in some embodiments a mesa may be substantially planar, e.g., within +/−10 degrees of planar.

Some of the mesas may have a substantially square shape, e.g. with mesa side walls +/−5 degrees of parallel, thereby creating a mesa top surface also with a substantially square shape. In some embodiments, the shapes of some of the mesas, which may include the mesa top surface, may be triangular, trapezoidal, or any another shape. For instance, some of the mesas at the outer edge of the pedestal in FIG. 1 have a mesa top surface with a boundary defined by both linear and nonlinear edges, e.g., forming a generally triangular area in some cases (albeit a triangle with a slightly curved side).

The wafer may rest on the mesa top surfaces, and the bulk of the gas that is trapped between the wafer and the wafer support surface may be located in the grooves. While there will be a much smaller volume of gas trapped between the wafer and the mesa top surfaces, the gas that is trapped between the wafer and the wafer support surface in the mesa areas must only travel as far as the nearest groove before it enters the larger volume of a groove (as opposed to travelling all the way to the edge of the wafer for a pedestal without grooves in order to escape). Due to the depth of the grooves, they may have a much higher flow-conductance than the flow-conductance of the small gap between the wafer and the mesa top surfaces, which allows gas that flows through the grooves to flow much faster and thus allows for much more rapid equalization of pressure between the trapped gas and the ambient gas in the chamber.

As discussed above, there may be at least two different sizes of groove that may be used in a pedestal such as that shown in FIG. 1. The present inventors determined that it may be advantageous to utilize to at least two different sizes of grooves to provide sufficient high-flow-conductance paths to allow gas trapped between the wafer and the wafer support surface to escape quickly (thus preventing the gas from getting trapped and forming the cushion mentioned above) while reducing the total amount of gas that may be trapped within the grooves beneath the wafer. If uniformly deep grooves are used across the entire pedestal face, e.g., the wafer support surface, then there may be sufficient gas trapped in the grooves that such gas may, during pumpdown of the chamber, expand more quickly than it can escape from the grooves (even taking into account the grooves' higher flow conductance), thereby causing the cushioning effect to reappear, which is undesirable. Thus, the present inventors determined that by using lower-flow-conductance passages, e.g., the shallower grooves, that feed into higher-flow-conductance passages, e.g., the deeper grooves, the total amount of gas that is trapped beneath the wafer may be reduced to a level where the trapped gas, during pumpdown, does not create the cushioning effect but still allows the gas trapped between the mesas and the wafer to escape without forming the cushion.

Figure 2:
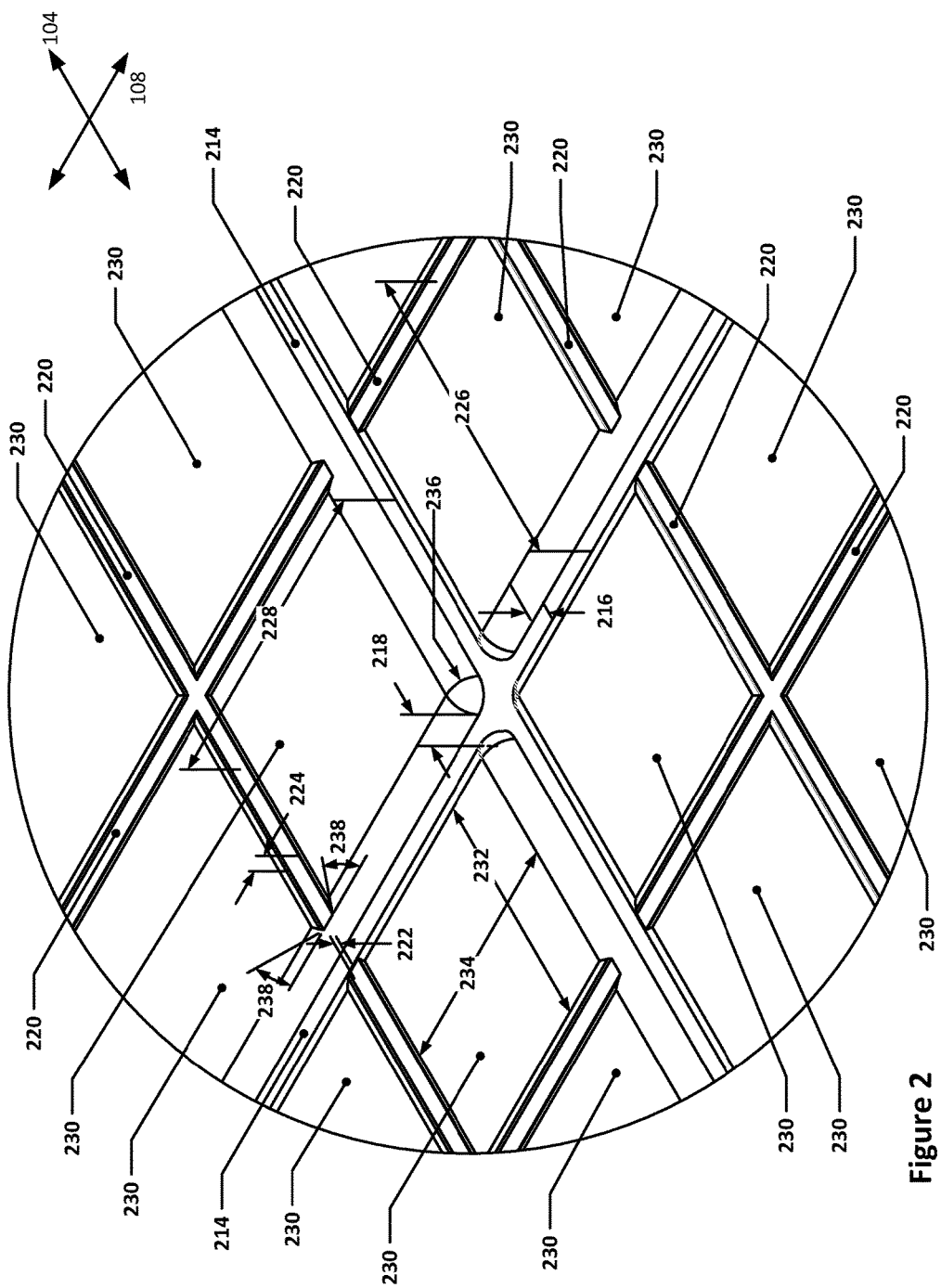
FIG. 2 depicts a detail view of portion A of the pedestal of FIG. 1.

FIG. 2 depicts a detail view of a portion of the pedestal of FIG. 1. The detail view of FIG. 2 is the portion identified with a dashed line and labeled "A" in FIG. 1. Two orthogonal deep grooves 214 are visible; as can be seen, the deep grooves 214 may have a first depth 216 (as measured from a mesa top surface) and a first width 218. In some embodiments, the grooves may be substantially orthogonal, e.g., within +/−5 degrees of orthogonal. In some implementations, as shown in FIG. 2, the first width 218 may be a width of the bottom of the deep groove 214. Correspondingly, numerous shallow grooves 220 are visible and may have a second depth 222 and a second width 224; similar to the first width 218, the second width 224 may be a width of the bottom of the shallow groove 220. The depths of the deep grooves in the plurality of deep grooves may be equal to each other and in some embodiments may be substantially equal, e.g., within +/−5% of the depths of the other deep grooves of the plurality of deep grooves. For instance, each deep groove in the plurality of deep grooves may be of equal or substantially equal depth to the other deep grooves in the plurality of deep grooves. Similarly, the depths of the shallow grooves in the plurality of shallow grooves may be equal to each other and in some embodiments may be substantially equal to each other.

The grooves may be spaced apart from one another by a distance 226 in one direction, e.g. a direction parallel to the first axis 104, and a distance 228 in an orthogonal direction, e.g. a direction parallel to the second axis 108, which may create mesas 230 having mesa top surface areas (not identified), for example, measuring a first mesa dimension 232 by a second mesa dimension 234. As stated herein, the spacing between the grooves, e.g., between deep grooves, between shallow grooves, or between shallow and deep grooves, may be equal spacing, but in some embodiments such spacing may be substantially equal, e.g., within +/−5% of the spacing between the other grooves; for instance, the shallow grooves may be spaced substantially equally apart by a distance and two such shallow grooves may be spaced apart by another distance that is, for instance, within +/−5% of the distance. In some other embodiments, the spacing between grooves, e.g., between deep grooves, between shallow grooves, or between shallow and deep grooves, may not be equal or substantially equal.

Figure 3:
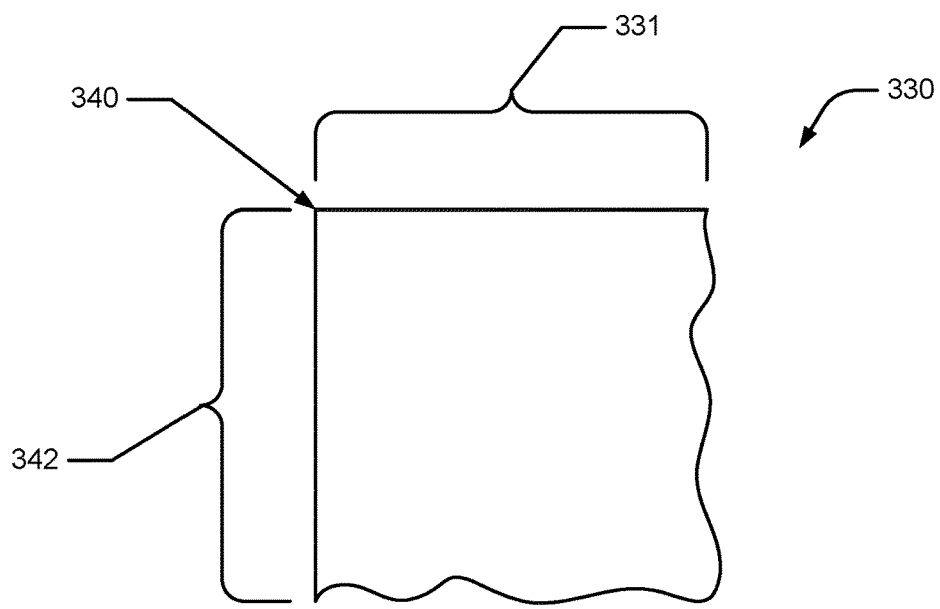
FIG. 3 depicts a profile view of a sharp upper edge of a sample mesa.

Each mesa top surface may be defined by a perimeter which may be formed, at least in part, by a plurality of upper edges which is where mesa side walls (not identified) and a mesa top surface intersect. As stated above, each mesa is bracketed by grooves and therefore, each mesa side wall of each mesa may be the boundary between that mesa and a groove that brackets that mesa. Because the sidewalls may extend between a mesa top surface and a bottom of a groove, they may be considered a mesa side wall, a groove side wall, or both a mesa side wall and a groove side wall. Depending on the configuration of a mesa, the upper edge may be a "sharp" or "hard" edge, such as a perpendicular corner between two surfaces, e.g. the mesa top surface and a mesa side wall. For instance, FIG. 3 depicts a profile view of a sharp upper edge of a sample portion of a mesa. As can be seen, mesa 330 includes an upper edge 340 that is a sharp corner where a mesa top surface 331 intersects with a mesa side wall 342.

Figure 4:
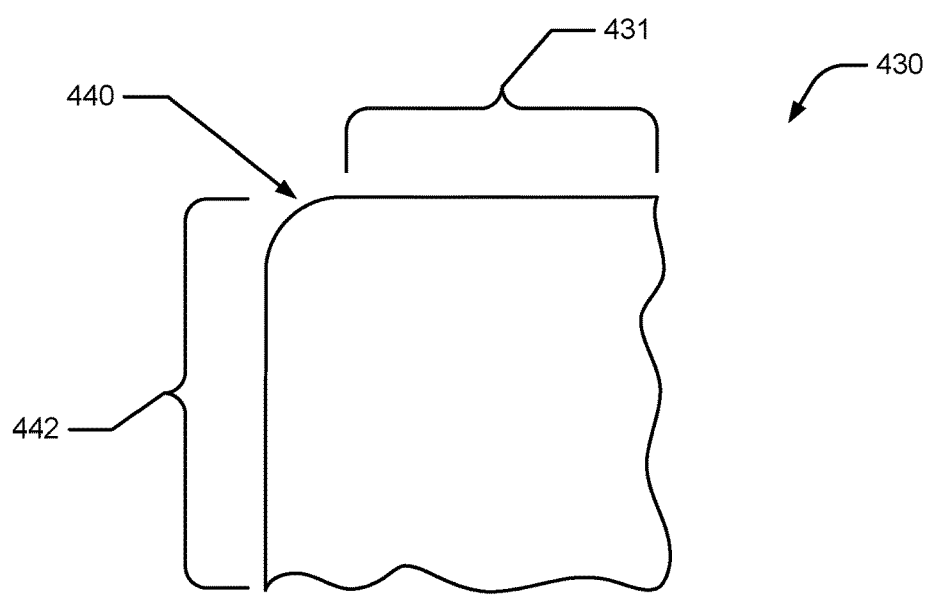
FIG. 4 depicts a profile view of an example rounded upper edge of another sample mesa.

In some embodiments, an upper edge of a mesa may be rounded and/or chamfered. For instance, FIG. 4 depicts a profile view of a rounded upper edge of the sample portion of the mesa of FIG. 3. Here, mesa 430 includes upper edge 440 that is rounded and forms a portion of mesa side wall 442; mesa top surface 431 is the planar portion depicted in the Figure within identifier bracket 431. Referring back to FIG. 2, the upper edges of the mesas corresponding to the deeper grooves may be rounded with a radius 236, and the upper edges of the mesas corresponding to the shallower grooves may be chamfered with an angle 238 and/or rounded in a similar fashion. As can be seen further in FIG. 2, the upper edge of a mesa may be rounded and/or chamfered such that an entire mesa side wall is rounded and/or at an oblique angle to the planar mesa top surface. For instance, in FIG. 2, each mesa side wall associated with a deep groove 214 is a curved surface from its intersection with the planar mesa top surface to its intersection with the deep groove 214. Similarly, for example, as can be seen in FIG. 2, each mesa side wall associated with a shallow groove 220 is a chamfered surface from its intersection with the planar mesa top surface to its intersection with the shallow groove 220. In some embodiments a majority of the mesas may have upper edges that are rounded and/or chamfered and in some such embodiments, substantially all, e.g., 90% or more, or the mesas may have upper edges that are rounded and/or chamfered. For example, all of the mesas depicted in FIGS. 1 and 2 have upper edges that are rounded and/or chamfered.

The values of these parameters may, in some implementations, be as summarized below.

| Dimension | Nominal (in) | Min (in) | Max (in) |
|---|---|---|---|
| 216 | 0.04 | 0.02 | 0.25 |
| 218 | 0.04 | 0.02 | 0.1 |
| 222 | 0.005 | 0.003 | 0.04 |
| 224 | 0.03 | 0.01 | 0.05 |
| 226 | 0.50 | 0.2 | 1 |
| 228 | 0.50 | 0.2 | 1 |
| 232 | 0.46 | 0.16 | 0.96 |
| 234 | 0.46 | 0.16 | 0.96 |
| 236 | 0.040 | 0.005 | 0.25 |
| 238 | 30° | 15° | 60° |

Figure 14:
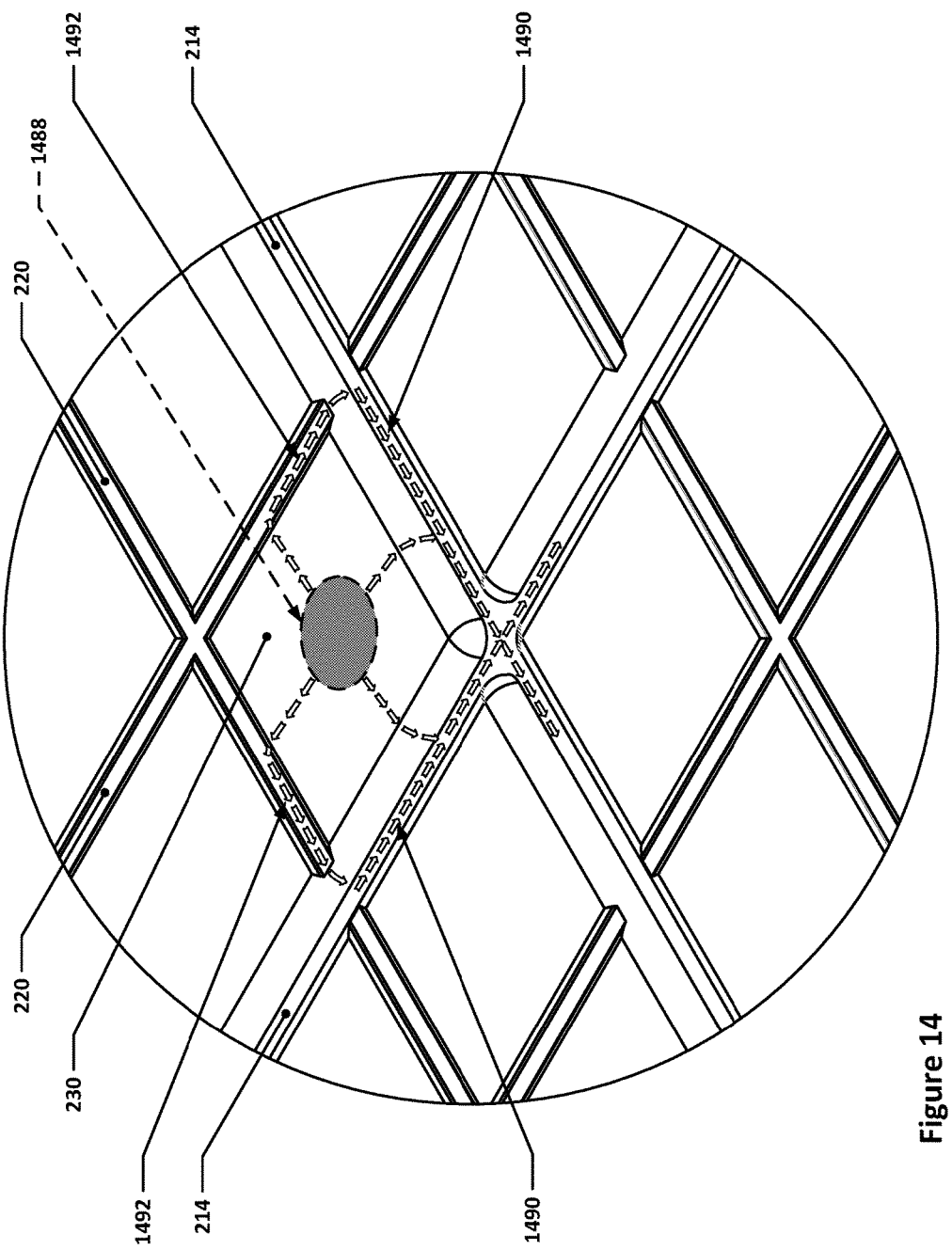
FIG. 14 depicts example gas flow paths from a mesa top surface to the grooves of FIG. 2.

FIG. 14 depicts example gas flow paths from a mesa top surface to the grooves of FIG. 2. An example pocket of gas 1488 that represents a pocket of gas located between a wafer and a mesa 230 is shown. As described above, the gas from the pocket of gas 1488 may flow along the mesa 230 directly into the deep grooves 214 as generally shown with arrows 1490. The gas from the pocket of gas may also flow directly into the shallow grooves 220, which may flow along the shallow grooves 220 to the deep grooves 214, as generally shown with arrows 1492. Once in the deep grooves, the gas may flow outwards, e.g. towards the edge of the pedestal, as indicated by arrows 1490. It should be noted that these arrows are not actual flow paths, but are examples of the general flows which gas may travel. Referring back to FIG. 1, as can be seen, the grooves may extend to the outer perimeter of the pedestal which may be configured to allow the gas to exit the pedestal. The gas that flows in the grooves may flow to the outer edge of the pedestal and/or to one of the evacuation ports.

Figure 15:
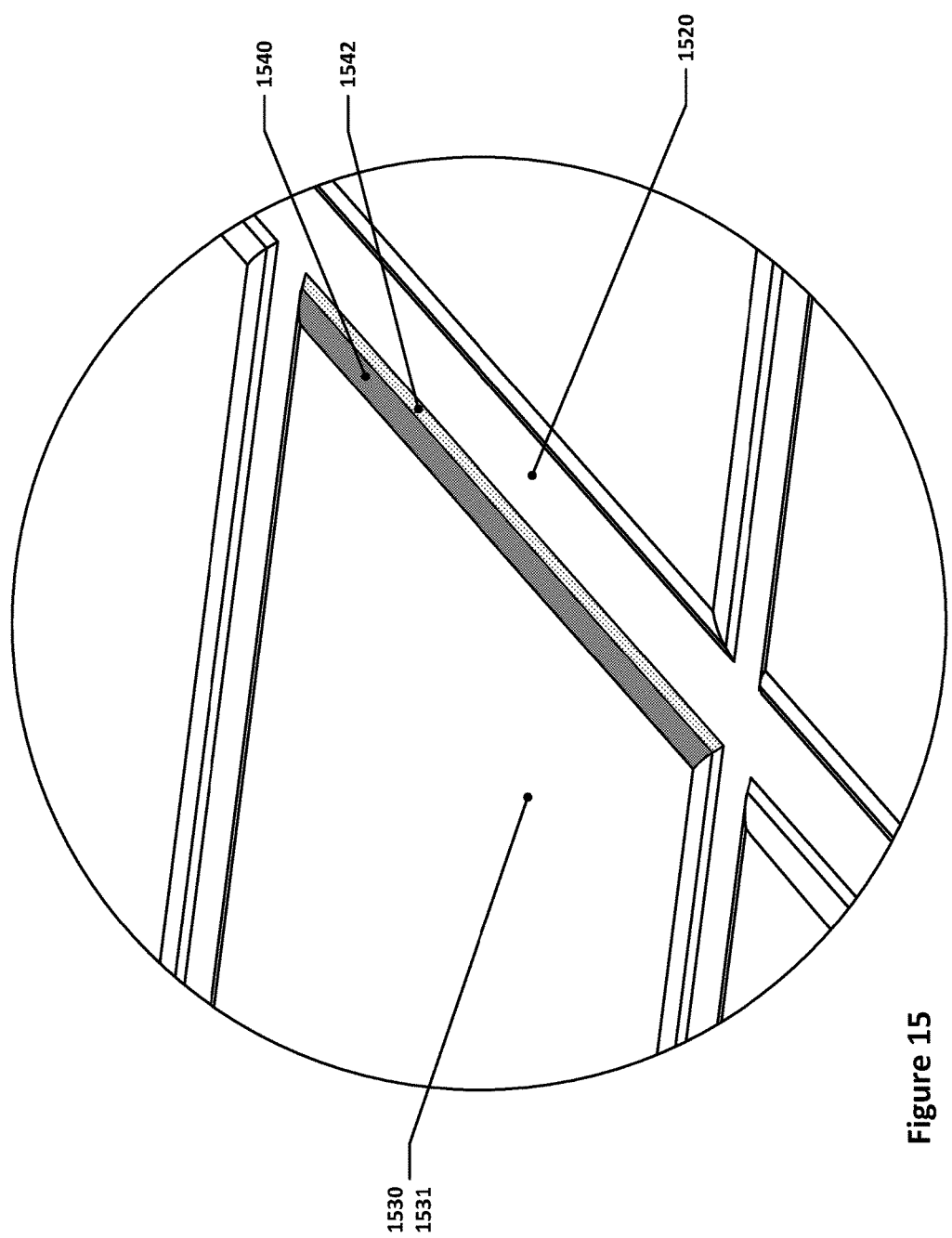
FIG. 15 depicts a different detail view of a portion of the pedestal of FIG. 1.

In some embodiments, the upper edges of the mesas and/or mesa side walls corresponding to the shallow grooves may be both chamfered and rounded. In some such embodiments, an upper portion of the upper edge that intersects with the mesa top surface may be rounded and a lower portion of the upper edge may be chamfered. Additionally, such chamfering may extend to and intersect with the bottom of the shallow groove; it may be considered that the upper edge is rounded and the mesa side wall is chamfered, e.g., angled. FIG. 15 depicts a different detail view of a portion of the pedestal of FIG. 1. For the shallow groove 1520 shown in FIG. 15, the upper edge 1540, identified with dark shading, is rounded while the mesa side wall 1542, identified with light shading, is chamfered. It may also be considered that both the rounded and chamfered sections, 1540 and 1542, respectively, are a part of the upper edge of the mesa 1530 or a part of the mesa side wall. For instance, section 1540 may be a rounded section of the upper edge and section 1542 may be a chamfered section of the upper edge. Regardless, as depicted in FIG. 15, the portion of material extending between the bottom of the shallow groove 1520 and the mesa top surface 1531 includes a chamfered portion that intersects with and extends away from the bottom of the shallow groove 1520 and intersects with a rounded portion that intersects with the mesa top surface 1530. The rounded section 1540 may have a nominal radius of 0.020 inches, a minimum radius of 0.005 inches, and a maximum radius of 0.1 inches. The chamfered section 1542 may have the same values of item 238 discussed above.

The pedestal may be made from aluminum or other electrically conductive material and may be coated with an oxidation layer, e.g., by hard anodizing the pedestal (or at least the surface facing the wafer). RF power may be routed through the pedestal and capacitively coupled to the wafer across the oxidation layer and any gap that may exist between the wafer and the pedestal. Such RF power may be used during wafer processing operations in order to generate an RF field above the wafer in order to form a plasma environment. The oxidation layer may help prevent high-voltage discharge events, e.g., arcing, between the wafer and the pedestal surface and/or grooves, by providing a layer of electrical insulation. In a hard anodization process, the oxidation layer may grow both inward and outward from the exterior surface of the pedestal. The oxidation layer may, for example, be approximately 0.003" thick. In areas where a sharp, i.e., hard, edge exists, the portion of the oxidation layer that grows away from the surface may grow in a direction normal to the exterior surface, resulting in a V-shaped trough that forms along the edge, with the edge located at the bottom of the trough. Since the oxidation layer at the bottom of the trough may have a much thinner "outward" thickness (or no thickness) than the rest of the oxidation layer, this may expose the underlying metal and generate a potential arcing location.

Figure 5:
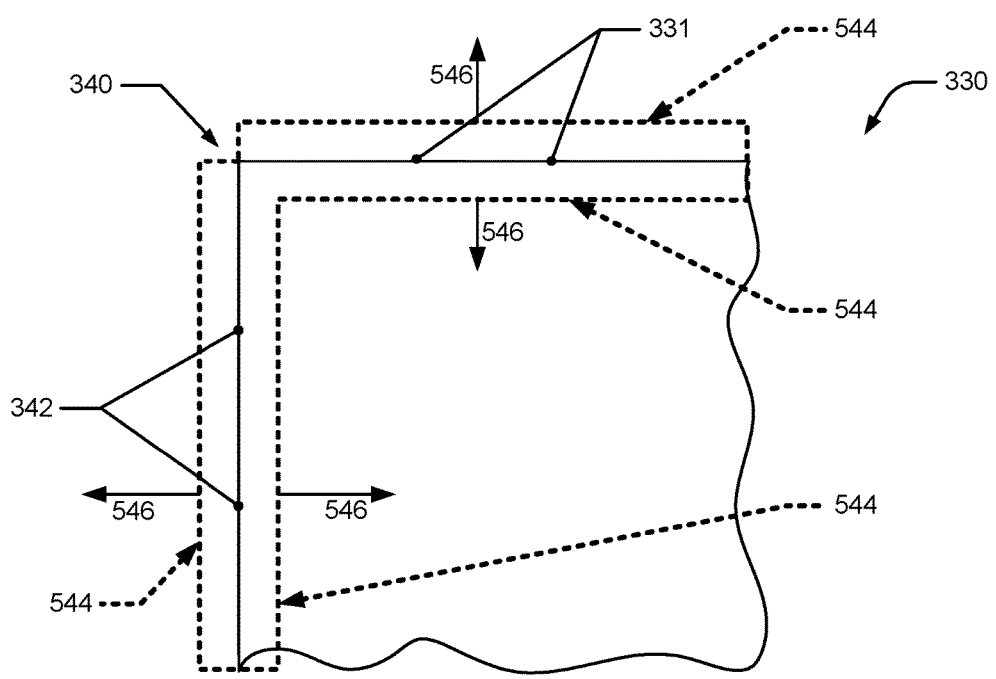
FIG. 5 depicts a profile view of an example of oxidation layer growth for the sharp upper edge of the sample mesa of FIG. 3.
Figure 6:
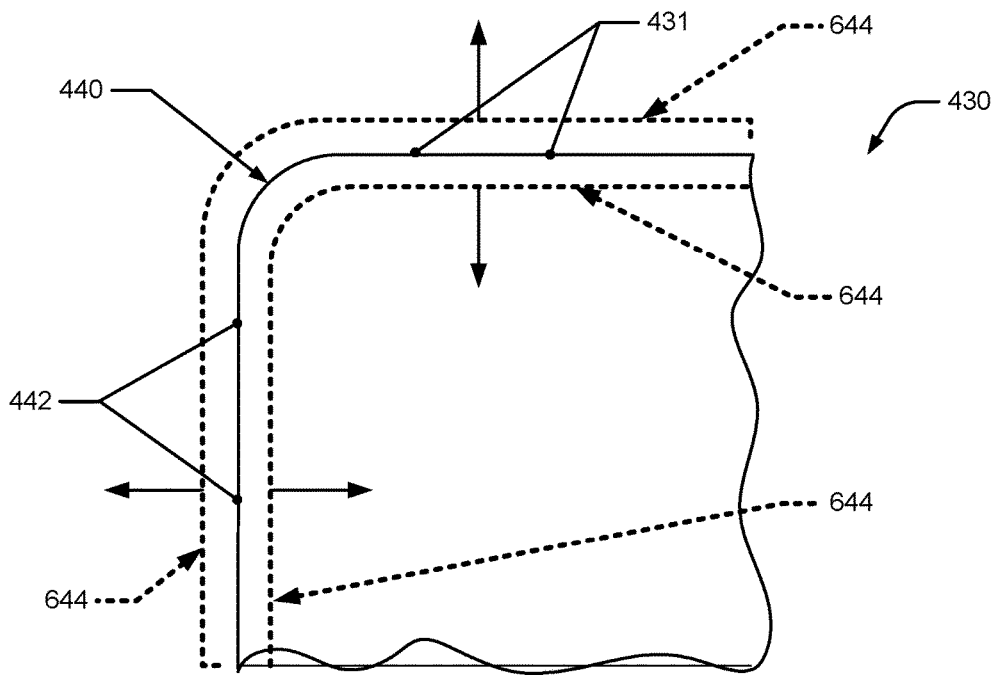
FIG. 6 depicts a profile view of an example of oxidation layer growth for the rounded upper edge of FIG. 4.

FIG. 5 depicts a profile view of an example of oxidation layer growth for the sharp upper edge of the sample mesa of FIG. 3. As can be seen, the sample mesa 330 includes a bi-directional growth of an oxidation layer 544, e.g., a hard anodization coating growth, on the mesa top surface 331 and the mesa side wall 342. The direction of the oxidation layer growth is identified by arrows labeled 546. This growth leaves a small V-shaped valley between the adjoining orthogonal oxidation layers at the hard upper edge location 340, as seen in the upper left of the Figure, and the hard upper edge 340 may potentially be exposed at the bottom of this valley, leaving a potential arcing location. In order to prevent such potential exposure, the hard upper edge 340 may be replaced with a rounded edge. FIG. 6 depicts a profile view of an example of oxidation layer growth for the rounded upper edge of FIG. 4. As can be seen, the sample mesa 430 includes a bi-directional growth of an oxidation layer 644, e.g., a hard anodization coating growth, on the mesa top surface 431 and the mesa side wall 442. However, different than in FIG. 5, the rounded upper edge 440 depicted in FIG. 6 may cause the oxidation layer 644 to grow so as to evenly coat the exterior surface, i.e. the planar mesa side wall 442 the mesa top surface 431, and the rounded upper edge 440, without generating V-shaped valleys, i.e., without creating potential arcing points.

Pedestals such as the above-described pedestal may be used in plasma environments in which ions may bombard the pedestal; this bombardment, which may be desirable when it occurs on the wafer, may be undesirable if it impacts components of the wafer processing chamber and/or the pedestal. For example, ion bombardment may have a detrimental effect on metal materials, such as the aluminum or other metal that the pedestal may be made from. Accordingly, such vulnerable materials may be protected from such bombardment by more robust materials, such as ceramics (the top surface of the pedestal, of course, is protected by the wafer itself).

Figure 7:
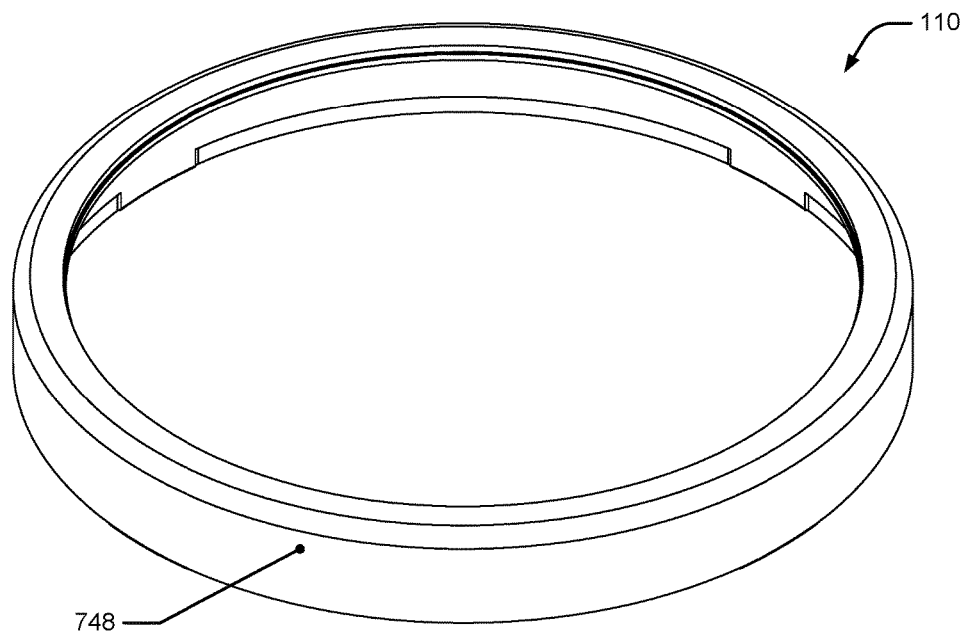
FIG. 7 depicts an isometric view of a guard ring.
Figure 8:
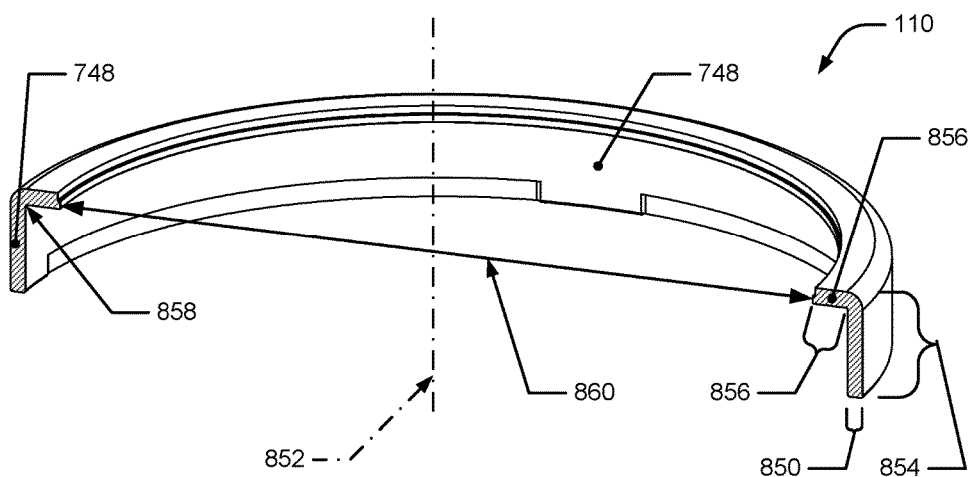
FIG. 8 depicts an off angle cross-sectional view of the guard ring of FIG. 7.

One such component is a guard ring, which is a large, thin-wall ring with a flange radiating inwards from one edge. The flange may have an inner diameter slightly smaller than the wafer, allowing the wafer to overlap with the flange—this may prevent ionized particles from traveling past the edge of the wafer and striking the pedestal. The guard ring may also extend down past the pedestal so as to protect the sides of the pedestal from bombardment as well. FIG. 7 depicts an isometric view of a guard ring and FIG. 8 depicts an off angle cross-sectional view of the guard ring of FIG. 7. As can be seen in FIG. 7, guard ring 110 is a thin-wall ring that includes a wall 748. FIG. 8 shows that the wall 748 has a thickness 850 in a direction perpendicular to an axis 852 around which the guard ring 110 extends. In some embodiments, the axis 852 may be a center axis of the guard ring 110. The wall 748 may also have a height 854 with a vertical component parallel to the axis 852 and in some embodiments, the height, i.e., the wall 748, may be parallel to the axis 852. The thickness 850 and/or the height 854 may also be substantially perpendicular or parallel, respectively, to the axis 852, such as within +/−10 degrees. The guard ring 110 in FIG. 8 also includes a flange 856 that extends inwards towards the axis 852, which may be considered the radial direction of the guard ring 110. The flange 856 is shown extending from an edge 858 of the wall 748. The inner diameter 860 of the flange 856 may be less than a diameter of a wafer (not depicted).

Figure 9:
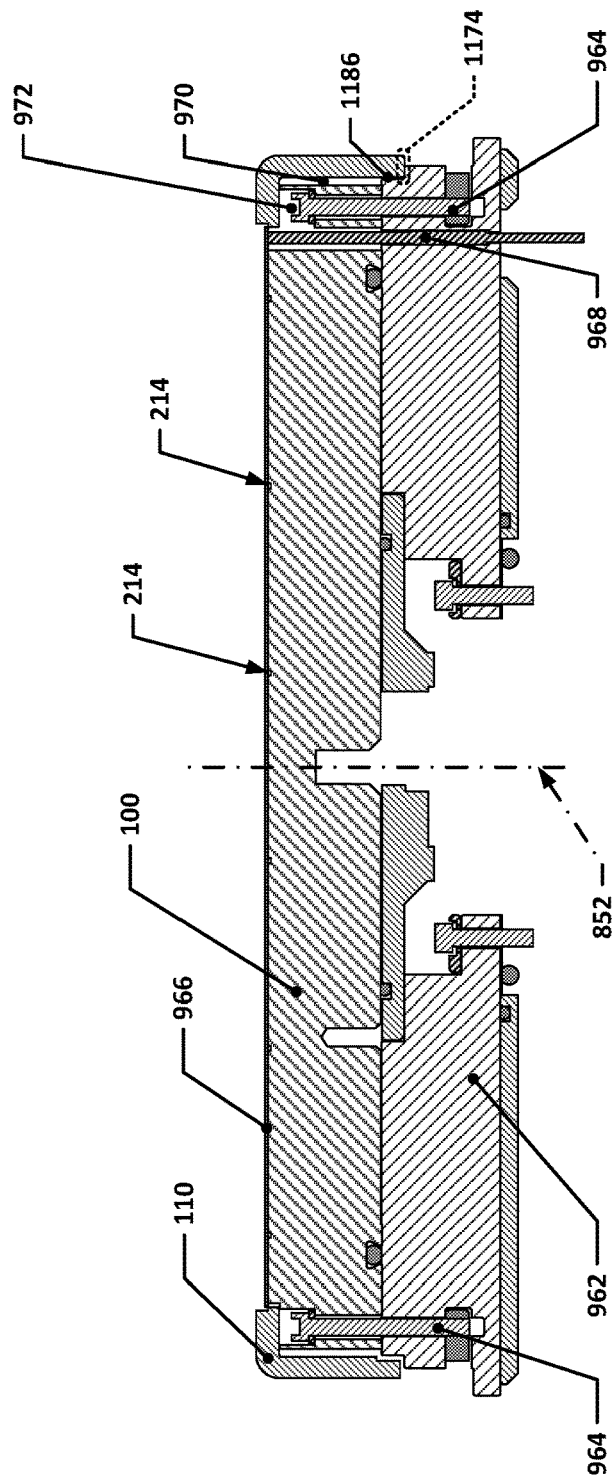
FIG. 9 depicts a removed section view of the pedestal of FIG. 1.

FIG. 9 depicts a removed section view of the pedestal of FIG. 1. As can be seen in FIG. 9, the pedestal 100 may be clamped to a ceramic baseplate 962 by a plurality of bolts and nuts, collectively 964, (two are visible). A portion of the ceramic guard ring 110 can be seen extending around an outer diameter (not identified) of the pedestal 100 which, as depicted in FIG. 9, is majority of the wall 848 of the guard ring 110 as well as a part of the flange 856. The guard ring 110 may also extend in a direction parallel to the axis of the ring 852 past the pedestal 100 and rest on the ceramic baseplate 962, as seen on the right side of the Figure. FIG. 9 also depicts a wafer 966 that has been placed on the pedestal 100 as well as some of the deep grooves 214 of the pedestal 100. The wafer may be placed on the pedestal such that it overlaps, and in some embodiments contacts, the flange 856. One lift pin 968 (at least two others may be included at other locations, but are not visible in this section view) can also be seen in FIG. 9 and which extends through the baseplate 962 and may be used to lift and/or lower the wafer 966 off and/or onto the pedestal 100. However, as can be seen in FIG. 9, a thin annular volume 970 may trap gas between the guard ring 110 and the pedestal 100, as well as a volume of gas 972 that is trapped within the multiple counterbored holes that are provided for the screws 964, which may present a problem in that these volumes of gas 970 and 972, respectively, are largely trapped and cannot easily escape during gas expansion caused by pumping down the chamber. As a result, these volumes of gas 970 and 972, respectively, may flow towards the wafer 966/guard ring 110 interface, which may also act to "float" the wafer 966 and may cause slippage between the wafer 966 and the pedestal 100.

Figure 10:
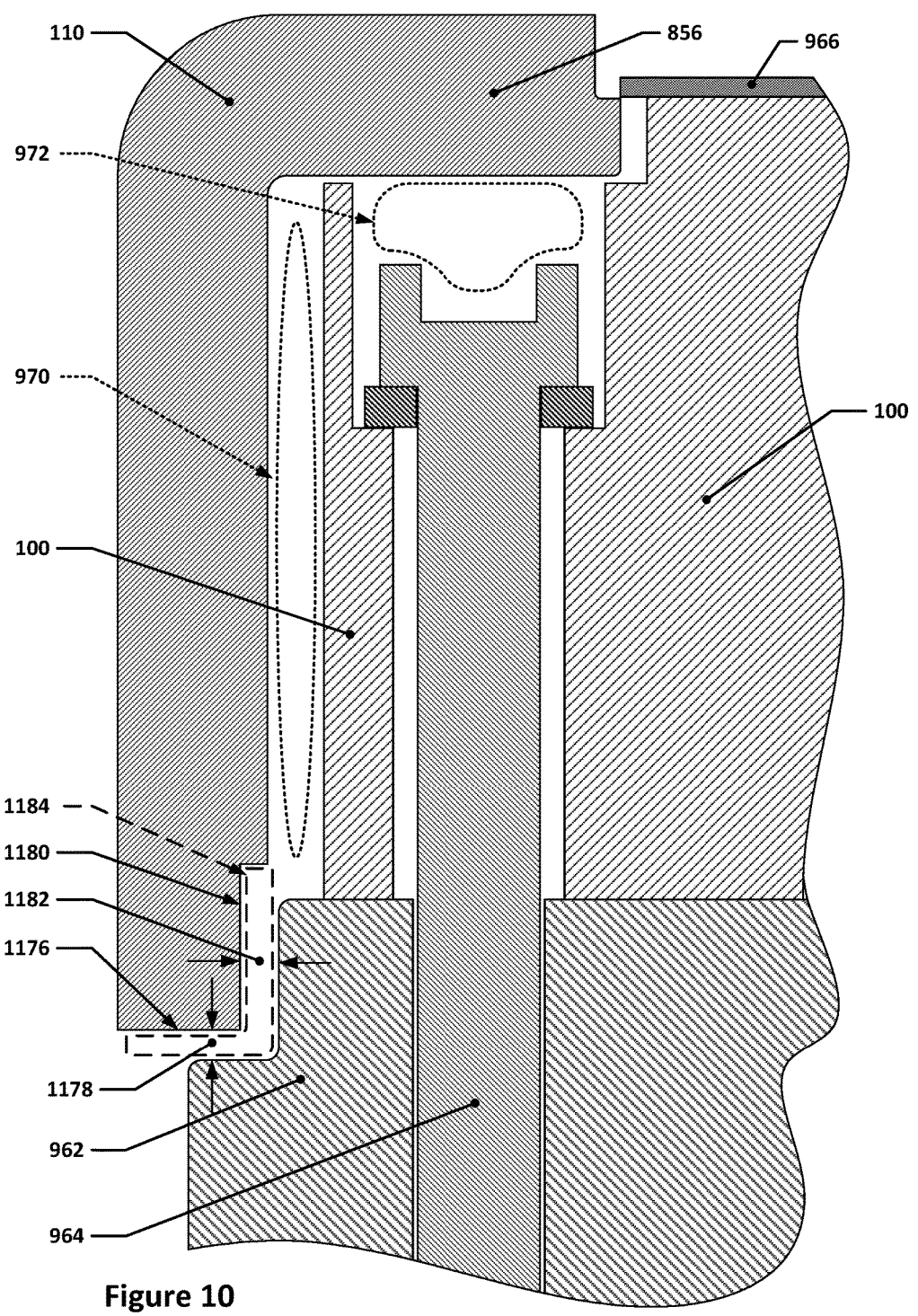
FIG. 10 depicts a magnified section of the left side of the pedestal of FIG. 9.

FIG. 10 depicts a detail view of a section of the left side of the pedestal of FIG. 9. The thin annular volume of gas 970 that may be trapped between the guard ring 110 and the pedestal 100, as well as the volume of gas 972 that may be trapped within the multiple counterbored holes that are provided for the screws 964, may be seen in greater detail than in FIG. 9. An example overlap between the wafer 966 and the flange 856 may also be seen in FIG. 10.

Figure 11:
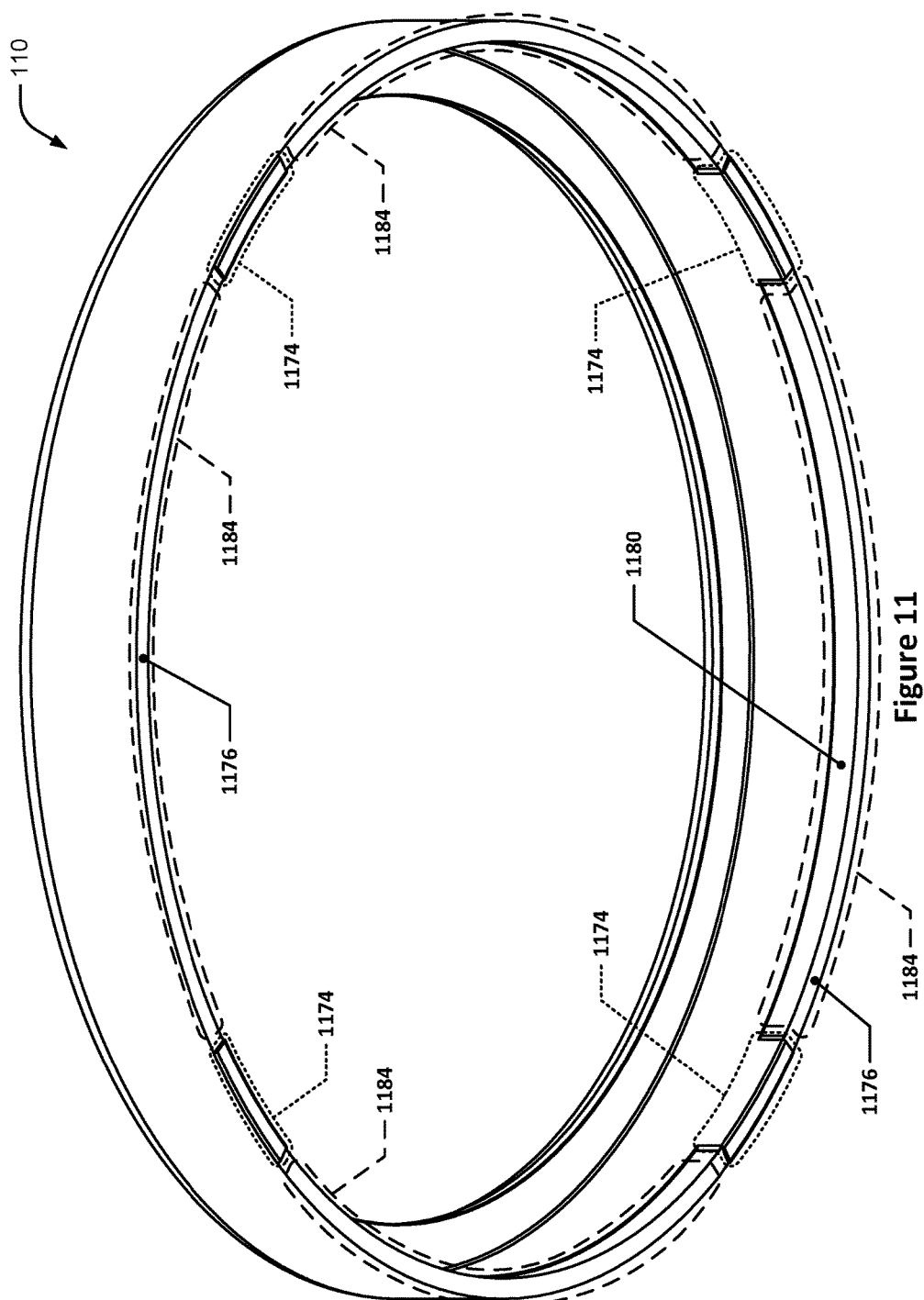
FIG. 11 depicts an off-angle view the guard ring shown in FIGS. 1 and 7-10.

In order to allow such gas to vent, the present inventors determined that modifying the guard ring such that it had feet that raised the bottom surface of the guard ring off of the ceramic baseplate and such that the interior surface of the guard ring that faced towards the ceramic baseplate was offset over most of its area from the ceramic baseplate would allow such trapped gas to easily vent. Such an example guard ring can be seen in FIG. 11 which depicts an off-angle view the guard ring shown in FIGS. 1 and 7-10. As can be seen, the guard ring 110 has four "foot areas" 1174 that may protrude past a bottom surface 1176 of the guard ring 110 such that the bottom surface 1176 is offset from baseplate 962, which may be referred to as a vertical gap 1178; in some embodiments this offset may be approximately 0.03 inches. This vertical gap 1178 may be in a direction parallel to the center axis, may be a first non-zero distance, and may also be seen in FIG. 10 between the two vertical arrows located above and below the "1178" indicator. Each foot area 1174 may contact the baseplate 962 and may support the weight of the guard ring 110.

Referring back to FIG. 11, a portion of an interior cylindrical surface of the guard ring 1180 that may face the baseplate 962, in the regions between the foot areas 1174, may be recessed in a direction perpendicular to the axis 852, thereby creating an annular gap area 1182 between the recessed interior cylindrical surface of the guard ring 1180 and the baseplate 962. This annular gap area 1182 may be in a direction parallel to the center axis, may be a second non-zero distance, and may be seen in FIG. 10 between the two horizontal arrows located on either side of the "1182" indicator. The vertical gap 1178 and the annular gap area 1182, which may be considered gas escape paths, may create a gap area 1184 which may also be seen in FIGS. 10 and 11. This gap area 1184 may allow any pressurized gas trapped within the guard ring, e.g. the annular volume of gas 970, to easily evacuate, thereby preventing a pressure build-up within the guard ring 110/pedestal 100 interface.

The interior diameter of the guard ring in the regions corresponding with the foot areas (or in other areas) may be sized so as to interface with the ceramic baseplate, thus centering the guard ring on the baseplate, as is identified at reference 1186 in FIG. 9.

Figure 12:
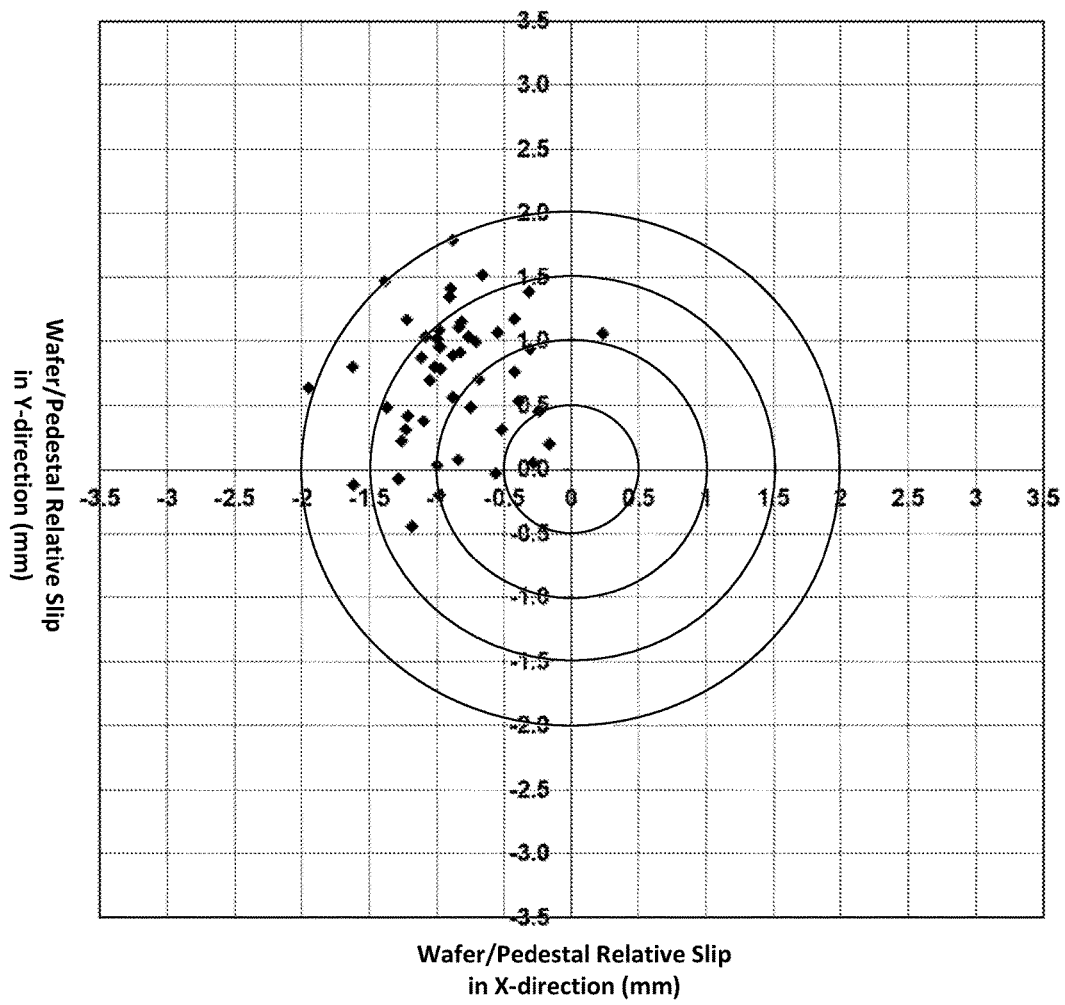
FIG. 12 depicts a graphical representation of relative displacement between a pedestal and a wafer for 40+ wafer placements on the pedestal with respect to a reference placement.

The above-discussed example was tested and showed exceptionally low amounts of slippage by the wafer relative to the pedestal. FIG. 12 depicts a graphical representation of relative displacement between a pedestal and a wafer for 40+ wafer placements on the pedestal with respect to a reference placement—at least two factors may contribute to such displacements: pedestal-wafer slip and the precision of the robot that is used to place the wafer on the pedestal; there may also be contributions due to thermal expansion effects and calibration errors in, for example, an active wafer centering system that is used to center the wafer on the pedestal. The pedestal in FIG. 12 is a flat pedestal, i.e., one that does not have grooves as discussed above. As can be seen, approximately 75% of the wafer placements exhibited wafer displacements greater than 1 mm, and approximately 20% of the placements exhibited displacements greater than 1.5 mm. Less than 5% of the placements had displacements of less than 0.5 mm.

Figure 13:
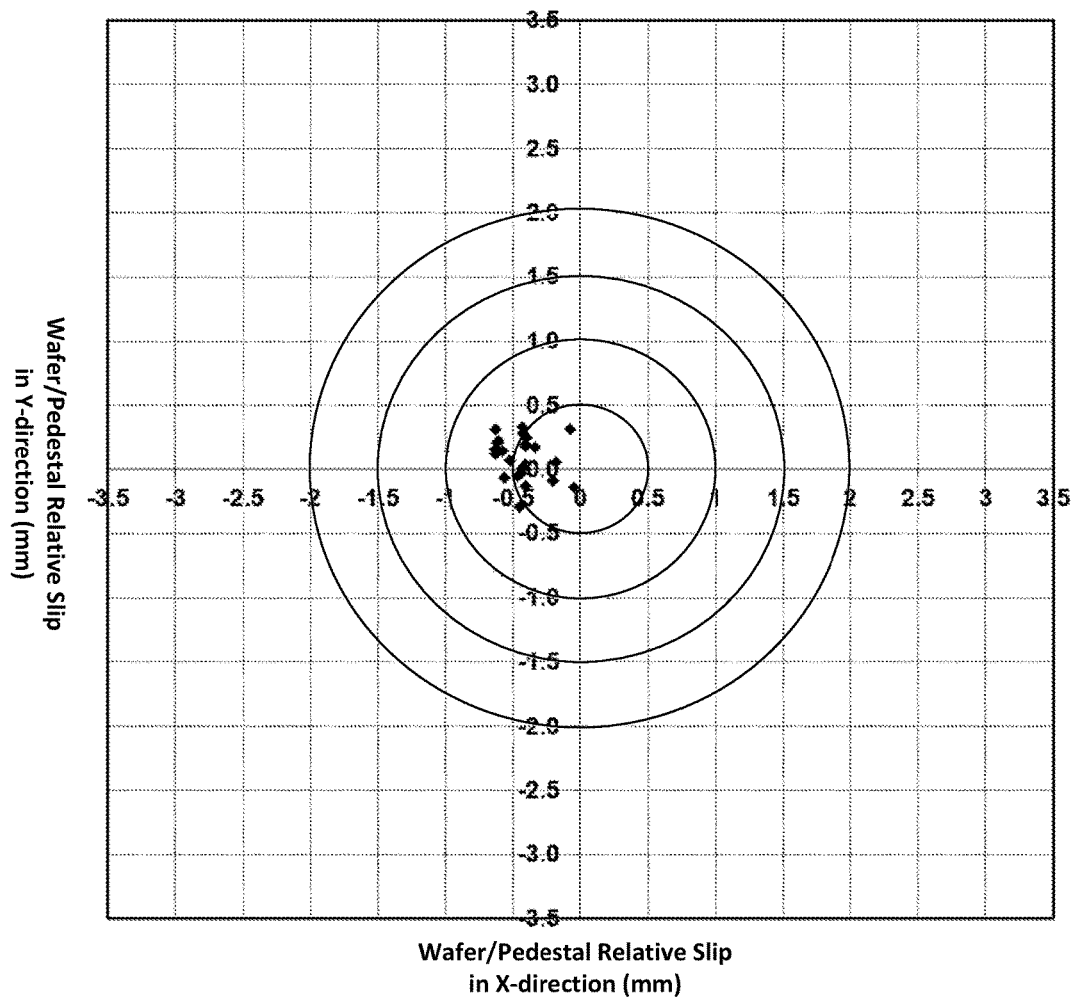
FIG. 13 depicts a graphical representation of relative displacement between the wafer and the pedestal for a number of wafer placements using a grooved pedestal, such as the one depicted in FIG. 1.

FIG. 13 depicts a graphical representation of relative displacement between the wafer and the pedestal for a number of wafer placements using a grooved pedestal, such as the one depicted in FIG. 1. As is clear from the data, the amount of displacement was reduced significantly, with all of the wafer placements exhibiting displacements of less than 1 mm, and over 50% of the wafer placements exhibiting displacements of less than 0.5 mm, which is a marked improvement as compared with the ungrooved pedestal. The sub-1 mm displacements shown are thought to be entirely due to the precision of the wafer handling robot (and, potentially, thermal effects and/or calibration errors in an active wafer centering system used with the robot); wafer/pedestal slippage is not believed to have contributed to the wafer displacements at all in these test data points.

The grooved pedestal designs discussed herein may provide superior performance compared with pedestals having flat wafer support surfaces. It is to be understood that the grooved pedestal designs discussed herein may be implemented in pedestals in which there is no active supply of gas to the underside of the wafer. For example, in some wafer processing systems, a purge gas and/or heat transfer gas, such as Helium, may be introduced between the wafer and the pedestal during processing operations to prevent process gases from flowing into the wafer-pedestal interface area. Such pedestals may also have grooves or channels of some type, but they are connected with one or more gas inlets that supply the purge and/or buffer gas during processing. The grooves used in the pedestals discussed above with reference to the drawings, however, are for a different purpose, i.e., passively eliminating wafer/pedestal slippage during wafer placement and chamber pumpdown as opposed to actively distributing gas to the underside of the wafer during processing operations in order to protect the pedestal and/or promote thermal conduction. Accordingly, the grooves of the pedestals discussed herein may, in some configurations, be placed in pedestals that do not have any features that may be used to supply gas to the grooves (aside from whatever ambient gas within the chamber is naturally trapped between the wafer and the pedestal).

In the pedestals discussed above, the grooves are straight; such grooves may be easily manufactured while still providing excellent anti-slippage performance, as exhibited in the test data discussed earlier. While the use of grooves on a pedestal as discussed herein is not limited to such straight grooves, other groove patterns may be more expensive to machine and may not provide appreciably greater performance. For example, the grooves may follow curved paths or fractal branching paths, although such paths are not as easy to manufacture as the straight grooves in the example discussed above.

In the examples discussed above, the grooves conduct trapped gas to the outer perimeter of the wafer, where it then flows past the guard ring and into the ambient chamber atmosphere. However, other variants of such pedestals may include grooves that do not flow to the edge of the wafer, but that conduct trapped gas to one or more ports located on the pedestal within the outer diameter of the wafer. These ports may lead to internal passages within the pedestal that may conduct trapped gas to the ambient environment of the chamber, e.g., such passages may simply be holes passing straight through the pedestal and baseplate so as to vent through the back surface of the pedestal/baseplate unit, or blind holes that intersect with radially-drilled holes in the pedestal to form L-shaped passages.

Unless the context of this disclosure clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also generally include the plural or singular number respectively. When the word "or" is used in reference to a list of two or more items, that word covers all of the following interpretations of the word: any of the items in the list, all of the items in the list, and any combination of the items in the list. The term "implementation" refers to implementations of techniques and methods described herein, as well as to physical objects that embody the structures and/or incorporate the techniques and/or methods described herein. Unless otherwise specified, the term "substantially" refers to within +/−5% of the value indicated. For example, "substantially parallel" means +/−5% of the angular range between 0° and 90°.

What is claimed is:

1. An apparatus for semiconductor processing, the apparatus comprising:
a pedestal that includes a wafer support surface that includes a plurality of mesas and a pattern of grooves, wherein:
  each mesa is bracketed between two or more grooves,
  each mesa includes a plurality of mesa side walls that each intersect, at least in part, with one of the grooves and with a mesa top surface that is a substantially planar surface,
  the mesa top surfaces are substantially coplanar with each other,
  the mesa top surfaces are configured to support a wafer during semiconductor operations,
  the pattern of grooves includes a first linear array of grooves parallel to and arrayed along a first axis and a second linear array of grooves parallel to and arrayed along a second axis,
  the first axis is substantially orthogonal to the second axis,
  the pattern of grooves is comprised of a plurality of deep grooves, each with a first depth and a first width, and a plurality of shallow grooves, each with a second depth and a second width,
  the first linear array of grooves includes two or more deep grooves and two or more shallow grooves,
  the second linear array of grooves includes two or more deep grooves and two or more shallow grooves
  the second depth is less than the first depth, and
  the second width is less than the first width.

2. The apparatus of claim 1, wherein the pedestal does not include features to supply gas to the grooves or to the mesas.

3. The apparatus of claim 1, wherein:
one or more shallow grooves of the first linear array are included between each pair of adjacent deep grooves of the first linear array, and
one or more shallow grooves of the second linear array are included between each pair of adjacent deep grooves of the second linear array.

4. The apparatus of claim 3, wherein:
the deep grooves in each linear array are equally spaced from adjacent deep grooves in that linear array,
three shallow grooves of the first linear array are located, and spaced substantially equally apart from each other, between each pair of deep grooves of the first linear array, and
three shallow grooves of the second linear array are located, and spaced substantially equally apart from each other, between each pair of deep grooves of the second linear array.

5. The apparatus of claim 1, wherein:
the grooves in the first linear array of grooves are spaced substantially equally apart from each other, and
the grooves in the second linear array of grooves are spaced substantially equally apart from each other.

6. The apparatus of claim 1, wherein:
each mesa includes a plurality of upper edges which form, at least in part, the perimeter of the mesa top surface of that mesa,
each upper edge is the intersection of a mesa top surface and a mesa side wall, and
one or more upper edges is one of: rounded and chamfered.

7. The apparatus of claim 6, wherein each upper edge of substantially all of the mesas is one of: rounded and chamfered.

8. The apparatus of claim 6, wherein each upper edge of substantially all of the mesas is rounded.

9. The apparatus of claim 6, wherein:
the upper edges of substantially all of the mesa side walls that intersect with a deep groove are rounded with a first radius, and
the upper edges of substantially all of the mesa side walls that intersect with a shallow groove are rounded with a second radius smaller than the first radius.

10. The apparatus of claim 9, wherein substantially all of the mesa side walls that intersect with a shallow groove are chamfered.

11. The apparatus of claim 9, wherein substantially all of the mesa side walls that intersect with a deep groove are curved surfaces.

12. The apparatus of claim 1, wherein one or more grooves extend to an outer perimeter of the pedestal.

13. The apparatus of claim 1, wherein the wafer support surface is coated with an oxidation layer.

14. The apparatus of claim 1, further comprising a guard ring that includes:
a wall that has a thickness in a direction perpendicular to a center axis of the guard ring and that has a height with a vertical component parallel to the center axis of the guard ring, and
a flange that extends inwards in a direction towards the center axis from an edge of the wall, wherein:
  at least a portion of the guard ring extends around an outer diameter of the pedestal,
  the flange has an inner diameter less than the diameter of the wafer, and
  the guard ring is configured to cause a wafer that is placed on the pedestal to overlap a section of the flange when viewed parallel to the center axis.

15. The apparatus of claim 14, further comprising a baseplate, wherein:
the pedestal is above and proximate to the baseplate,
the wall of the guard ring extends downwards past the pedestal in a direction parallel to the center axis, the wall of the guard ring further includes a wall bottom surface, the guard ring further includes one or more foot areas that extend past the wall bottom surface, that each include a foot area bottom surface that is offset from the wall bottom surface in a direction parallel to the center axis, and that contact the baseplate to cause the wall bottom surface to be offset from the baseplate in a direction parallel to the center axis by a first non-zero gap, and at least a portion of an interior surface of the guard ring that faces towards the baseplate in a direction perpendicular to the center axis is recessed to cause the portion of the interior surface to be offset from the baseplate in a direction perpendicular to the center axis by a second non-zero gap.

16. The apparatus of claim 15, wherein the guard ring has an interior diameter in each region corresponding with each foot region that causes the guard ring and baseplate to interface such that the guard ring is centered on the baseplate.

17. An apparatus for semiconductor processing, the apparatus comprising:

a pedestal that includes a wafer support surface that includes a plurality of mesas and a pattern of grooves;

a guard ring that includes:

a wall that has a thickness in a direction perpendicular to a center axis of the guard ring, that has a height with a vertical component parallel to the center axis of the guard ring, and that has a wall bottom surface, a flange that extends inwards in a direction towards the center axis from an edge of the wall, one or more foot areas that extend past the wall bottom surface and that each include a foot area bottom surface that is offset from the wall bottom surface in a direction parallel to the center axis; and a baseplate, wherein:

each mesa is bracketed between two or more grooves, each mesa includes a plurality of mesa side walls that each intersect, at least in part, with one of the grooves and with a mesa top surface that is a substantially planar surface, the mesa top surfaces are substantially coplanar with each other, the mesa top surfaces are configured to support a wafer during semiconductor operations, at least a portion of the guard ring extends around an outer diameter of the pedestal, the flange has an inner diameter less than the diameter of the wafer, the guard ring is configured to cause a wafer that is placed on the pedestal to overlap a section of the flange when viewed parallel to the center axis, the pedestal is above and proximate to the baseplate, the wall of the guard ring extends downwards past the pedestal in a direction parallel to the center axis, the foot areas contact the baseplate to cause the wall bottom surface to be offset from the baseplate in a direction parallel to the center axis by a first non-zero gap, and at least a portion of an interior surface of the guard ring that faces towards the baseplate in a direction perpendicular to the center axis is recessed to cause the portion of the interior surface to be offset from the baseplate in a direction perpendicular to the center axis by a second non-zero gap.

18. The apparatus of claim 17, wherein the guard ring has an interior diameter in each region corresponding with each foot region that causes the guard ring and baseplate to interface such that the guard ring is centered on the baseplate.

19. The apparatus of claim 17, wherein the guard ring and the baseplate are both comprised of a ceramic.

* * * * *